(12) United States Patent
Singh

(10) Patent No.: US 9,217,923 B2
(45) Date of Patent: Dec. 22, 2015

(54) METHOD OF USING AN EUV MASK DURING EUV PHOTOLITHOGRAPHY PROCESSES

(71) Applicant: GLOBALFOUNDRIES Inc., Grand Cayman (KY)

(72) Inventor: Mandeep Singh, Delft (NL)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/711,377

(22) Filed: May 13, 2015

(65) Prior Publication Data

US 2015/0248059 A1 Sep. 3, 2015

Related U.S. Application Data

(62) Division of application No. 14/080,939, filed on Nov. 15, 2013, now Pat. No. 9,075,316.

(51) Int. Cl.
*G03F 7/20* (2006.01)
*G03F 1/24* (2012.01)
*G03F 1/48* (2012.01)

(52) U.S. Cl.
CPC .. *G03F 7/20* (2013.01); *G03F 1/24* (2013.01); *G03F 1/48* (2013.01); *G03F 7/2002* (2013.01); *G03F 7/2004* (2013.01)

(58) Field of Classification Search
CPC .............. G03F 1/24; G03F 1/48; G03F 7/20; G03F 7/2002; G03F 7/2004
USPC ............................................. 430/5, 311, 394
See application file for complete search history.

(56) References Cited

U.S. PATENT DOCUMENTS

| | | | |
|---|---|---|---|
| 5,356,662 A | 10/1994 | Early et al. | |
| 6,984,475 B1 | 1/2006 | Levinson et al. | |
| 7,300,724 B2 | 11/2007 | Yan | |
| 2004/0025542 A1 | 2/2004 | Ball et al. | |
| 2004/0121593 A1 | 6/2004 | Matsunuma | |
| 2004/0126670 A1 | 7/2004 | Liang et al. | |
| 2004/0175629 A1 | 9/2004 | Wasson et al. | |
| 2005/0026046 A1 | 2/2005 | Yan | |
| 2005/0277030 A1 | 12/2005 | Yan | |
| 2006/0127780 A1 | 6/2006 | Chandhok et al. | |
| 2006/0237303 A1 | 10/2006 | Hosoya et al. | |
| 2006/0270226 A1 | 11/2006 | Hosoya | |
| 2007/0275308 A1 | 11/2007 | Hosoya et al. | |
| 2008/0266651 A1 | 10/2008 | Murakami et al. | |
| 2008/0318140 A1 | 12/2008 | Hayashi et al. | |
| 2009/0130574 A1 | 5/2009 | Hayashi et al. | |
| 2010/0084375 A1 | 4/2010 | Hosoya | |
| 2011/0217633 A1 | 9/2011 | Hosoya | |
| 2012/0145534 A1 | 6/2012 | Kageyama | |
| 2013/0100428 A1 | 4/2013 | Ruoff et al. | |
| 2013/0193565 A1 | 8/2013 | Tu et al. | |

OTHER PUBLICATIONS

Bajt et al., "Improved reflectance and stability of Mo—Si multilayers," Opt. Eng., 41:1797-1804, Aug. 2002.
Braun et al., "Mo/Si Multilayers with Different Barrier Layers for Applications as Extreme Ultraviolet Mirrors," Jpn. J. Appl. Phys., 41:4074-4081, 2002.
Windt et al., "Interface imperfections in metal/Si multilayers," Journal of Applied Physics, 71:2675-2678, Mar. 1992.
Yanagihara et al., "In situ performance tests of soft-x-ray multilayers mirrors exposed to synchrotron radiation from a bending magnet," Applied Optics, 31:972-976, Mar. 1992.

*Primary Examiner* — Christopher Young
(74) *Attorney, Agent, or Firm* — Amerson Law Firm, PLLC

(57) ABSTRACT

The present disclosure is directed to various masks for use during EUV photolithography processes. In one example, an EUV mask is disclosed that includes, among other things, a substrate, a multilayer stack comprised of a plurality of multilayer pairs of ruthenium and silicon formed above the substrate, wherein the mask is adapted to, when irradiated with EUV light, have an effective reflective plane that is positioned 32 nm or less below an uppermost surface of the multilayer stack and a capping layer positioned above the uppermost surface of the multilayer stack.

7 Claims, 10 Drawing Sheets

METHOD OF USING AN EUV MASK DURING EUV PHOTOLITHOGRAPHY PROCESSES

CROSS-REFERENCE TO RELATED APPLICATION

This is a divisional of co-pending application Ser. No. 14/080,939, filed Nov. 15, 2013.

BACKGROUND OF THE INVENTION

1. Field of the Invention

Generally, the present disclosure relates to the manufacture of semiconductor devices, and, more specifically, to various novel masks for use during extreme ultraviolet (EUV) photolithography processes.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. In general, integrated circuit devices are formed by performing a number of process operations in a detailed sequence or process flow. Such process operations typically include deposition, etching, ion implantation, photolithography and heating processes that are performed in a very detailed sequence to produce the final device.

Device designers are under constant pressure to increase the operating speed and electrical performance of transistors and integrated circuit products that employ such transistors. One technique that continues to be employed to achieve such results is the reduction in size of the various devices, such as the gate length of the transistors. The gate length (the distance between the source and drain regions) on modern transistor devices may be approximately 22-50 nm, and further downward scaling is anticipated in the future. Manufacturing devices that are so small is a very difficult challenge, particularly for some processes, such as photolithography tools and techniques.

A typical photolithography process generally involves the steps of: (1) applying a layer of photoresist (a light-sensitive material) onto a wafer or substrate, typically accomplished by a spin-coating process; (2) pre-baking (or soft-baking) the layer of photoresist at a temperature of approximately 90-12° C. to reduce the level of solvents in the layer of photoresist and to improve the adhesion characteristics of the photoresist; (3) performing an exposure process, wherein a pattern on a reticle or mask is projected onto the layer of photoresist used in a lithographic exposure tool to create a latent image in the layer of photoresist; (4) performing a post-exposure bake on the layer of photoresist at a temperature approximately 5-15° C. higher than the pre-bake process; (5) performing a develop process to turn the latent image in the layer of photoresist into the final resist image; and (6) performing a post-bake process (or hard-bake) at a temperature of approximately 125-160° C. to remove residual solids and to improve adhesion of the patterned photoresist mask. These process steps result in a "post-litho" patterned etch mask that may be used for a variety of purposes, e.g., as an etch mask to form trench/hole type features in an underlying layer of insulating material. The above processes are well known to those skilled in the art and, thus, will not be described herein in any greater detail.

By way of background, photolithography tools and systems typically include a source of radiation at a desired wavelength, an optical system and, as noted above, a mask or reticle that contains a pattern that is desired to be formed on a wafer. Radiation is provided through or reflected off the mask or reticle to form an image on a light-sensitive layer of photoresist material that is formed on the surface of a semiconductor wafer. The radiation used in such systems may be light, such as ultraviolet light, deep ultraviolet light (DUV), vacuum ultraviolet light (VUV), extreme ultraviolet light (EUV), etc. The radiation may also be x-ray radiation, e-beam radiation, etc. Currently, most of the photolithography systems employed in semiconductor manufacturing operations are so-called deep ultraviolet systems (DUV) that generate radiation at a wavelength of 248 nm or 193 nm. However, the capabilities and limits of traditional DUV photolithography systems are being tested as device dimensions continue to shrink. This has led to the development of so-called extreme ultraviolet systems, i.e., EUV systems that use radiation with a much shorter wavelength, e.g., less than 20 nm, and, in some particular cases, about 13.5 nm. One fundamental difference between DUV systems and EUV systems involves the structure of the reticle, and the manner in which light interacts with the reticle. In a DUV system, light (from the light source) passes through the reticle and irradiates a layer of light-sensitive material. In contrast, in a EUV (or soft x-ray) light system, light (from the light source) is reflected off of an optical interference coating structure, a multi-layered mask, onto the light-sensitive material.

FIGS. 1A-1B depict one illustrative example of a prior art EUV mask 10. The mask 10 generally includes a substrate 12, a multilayer film stack 14, a cap layer 16 and an absorber layer 18. The multilayer stack 14 is comprised of a plurality of multilayer pairs, wherein each multilayer pair is comprised of a first layer 14A and a second layer 14B. In one example, the first layer 14A may be a layer of molybdenum and the second layer 14B may be a layer of silicon. Typically, in current-day technology, the mask 10 may include about 40-50 of such multilayer pairs. The thickness of the layers 14A, 14B is established such that incident light is reflected—in phase—from each of the interfaces in the multilayer stack 14.

The capping layer 16 is provided to make the mask 10 more chemically stable and more durable during use. Typically, the capping layer 16 may be a layer of ruthenium having a thickness of about 2 nm. The absorber 18 is comprised of one or more layers of material that are adapted to absorb incident light from the light source of the EUV system. For example, the absorber 18 may be comprised of a tantalum-based material, e.g., tantalum nitride or tantalum boron nitride, and it may have a thickness of about 50-70 nm. The various layers of material depicted in FIG. 1A may be formed by performing known manufacturing processes, e.g., physical vapor deposition (PVD), electron beam deposition (EBD), chemical vapor deposition (CVD), plasma-enhanced versions of such processes, etc.

FIG. 1B depicts the mask 10 after a patterning process operation was performed on the absorber 18 to define a patterned absorber layer 18A that contains the pattern that is to ultimately be imaged onto a layer of photoresist material. Traditional photolithography and etching techniques may be used to produce the patterned absorber layer 18A. Traditional photolithography can be used to pattern the absorber 18 as the pattern in the absorber 18A is four times larger (a 4× magnification) than the actual pattern to be formed in the layer of photoresist material. Typically, such a prior art mask 10 may have an efficiency of up to around 70-75%, i.e., the mask 10 reflects from 65-75% of the incident light 20 (the reflected light is depicted by dashed arrow 22).

One problem with the prior art mask 10 is related to the thickness of the absorber 18, which, as noted above, may be about 50-70 nm using materials traditionally used for the absorber 18. Theoretically, there are some materials that might be used for the absorber that may be formed to a lesser thickness, e.g., about 30 nm. However, these thinner absorber materials have never been used in production environments. The use of the relatively thick absorber materials results in significant shadowing of the incident light 20 in an EUV mask. That is, the thickness of the absorber 18 (about 50-70 nm) is about 3.5-4 times the 13.5 nm wavelength of the EUV light used in EUV systems. Such shadowing can cause significant errors in the photolithography process, e.g., pattern placement errors, line width errors, etc. Moreover, the thicker absorber 18 mandates that the incident light 22 hit the mask 10 at a lower angle of incidence, since, from pure geometrical considerations, the shadowing increases with higher angles of incidence. The maximum angle of a ray impinging on a mask increases with numerical aperture (NA), but a high NA is necessary to get to finer resolutions in EUV lithographic stepper-scanners. Simply decreasing the thickness 18T of the absorber 18 is not readily available as current-day absorbers are made about as thin as possible given absorption coefficient of materials that are typically used to make the absorber 18. Moreover, simply decreasing the thickness of the absorber may lead to an increase in "leakage" of the patterned absorber 18A, i.e., a thinner absorber may not be as effective in blocking the incident light 22 as a thicker absorber 18A, which also may result in patterning errors.

The present invention is directed to various masks for use during EUV photolithography processes that may reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various masks for use during EUV photolithography processes. In one example, an EUV mask is disclosed that includes, among other things, a substrate, a multilayer stack comprised of a plurality of multilayer pairs of ruthenium and silicon formed above the substrate, wherein the mask is adapted to, when irradiated with EUV light, have an effective reflective plane that is positioned 32 nm or less below an uppermost surface of the multilayer stack, and a capping layer positioned above the uppermost surface of the multilayer stack.

In another example, an EUV mask is disclosed that includes, among other things, a substrate, a multilayer stack comprised of a plurality of multilayer pairs of ruthenium and silicon formed above the substrate, wherein the mask is adapted to, when irradiated with EUV light, have an effective reflective plane that is positioned 32 nm or less below the uppermost surface of the multilayer stack and wherein each of the layers of ruthenium in the multilayer stack has a thickness that falls within the range of about 2.5-3.6 nm and each of the layers of silicon in the multilayer stack has a thickness that falls within the range of about 3.6-4.8 nm, and a capping layer comprised of ruthenium positioned above the uppermost surface of the multilayer stack.

In yet another illustrative example, a method disclosed herein includes, among other things, positioning an EUV mask in a photolithography system, where the EUV mask is comprised of a multilayer stack comprised of a plurality of multilayer pairs of ruthenium and silicon, wherein the mask is adapted to, when irradiated with light having a wavelength of 20 nm or less, have an effective reflective plane that is positioned 32 nm or less below an uppermost surface of the multilayer stack, directing an EUV light having a wavelength of 20 nm or less toward the EUV mask, and irradiating a first layer of light-sensitive material positioned above a first substrate with a portion of the EUV light that reflects off of the EUV mask.

BRIEF DESCRIPTION OF THE DRAWINGS

The disclosure may be understood by reference to the following description taken in conjunction with the accompanying drawings, in which like reference numerals identify like elements, and in which.

Figure 1A:
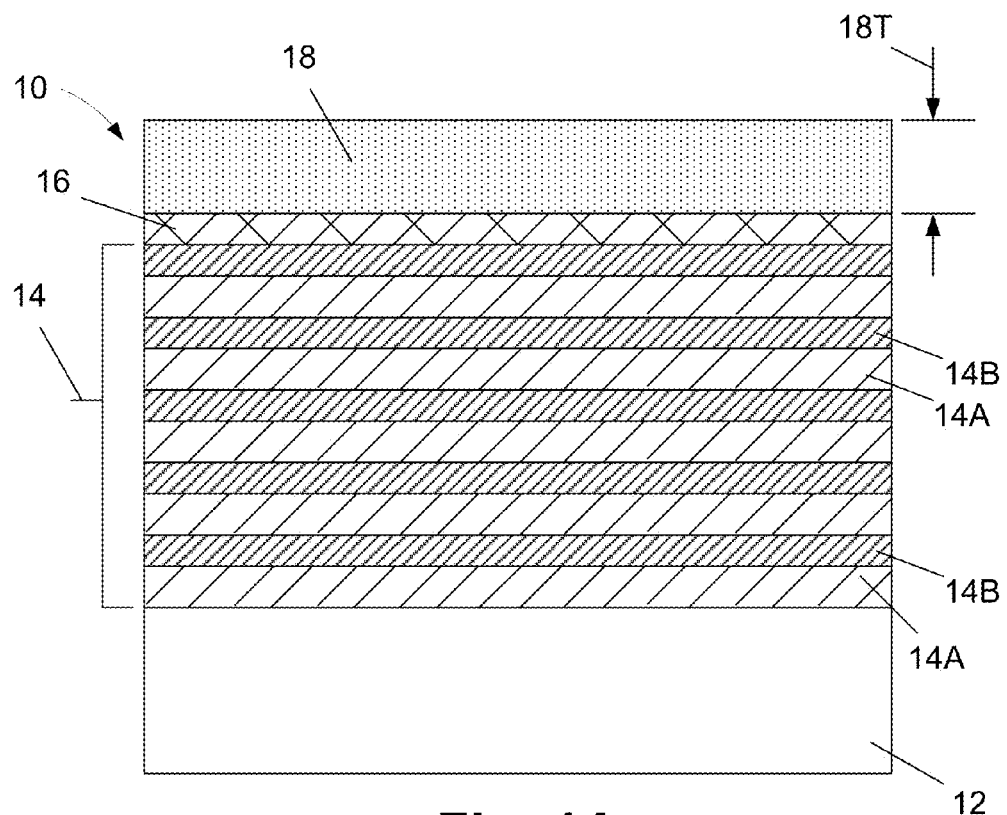
FIGS. 1A-1B depict an illustrative embodiment of a prior art EUV mask.
Figure 1B:
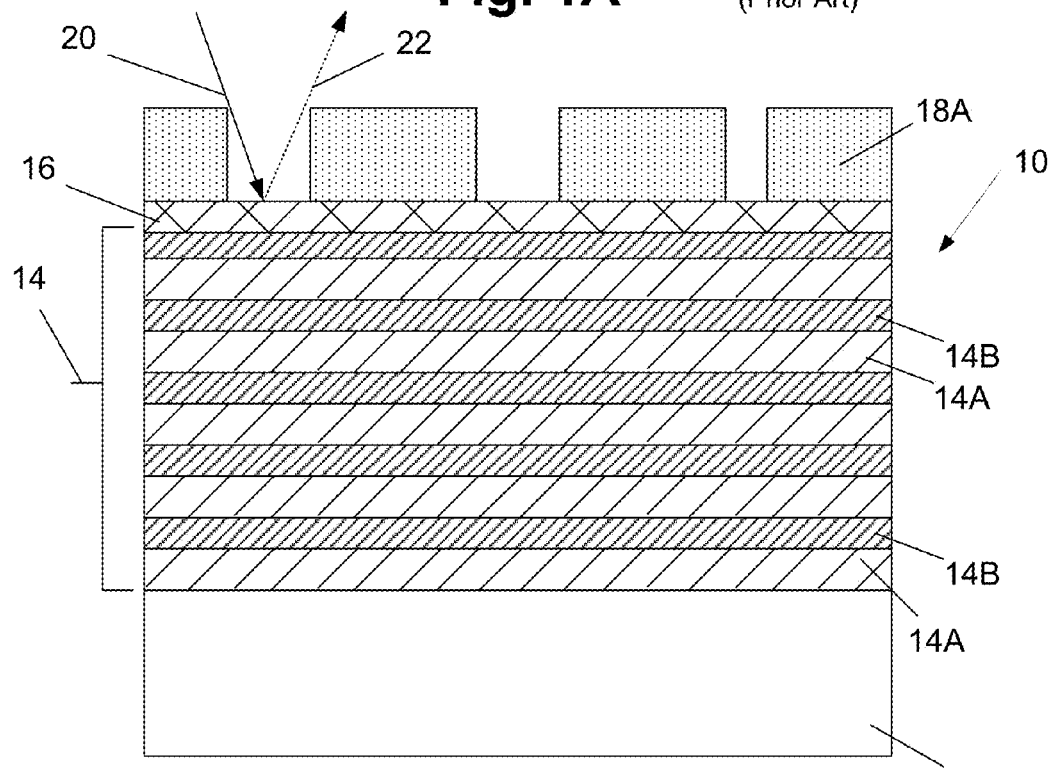

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various EUV masks for use during EUV photolithography processes. In general, such EUV systems use EUV light having a wavelength of about 20 nm or less, and in some cases about 13.5 nm. As will be readily apparent to those skilled in the art upon a complete reading of the present application, the masks disclosed herein may be employed in connection with the fabrication of a variety of devices, including, but not limited to, semiconductor devices, such as logic devices, memory devices, nano-optical devices, etc. With reference to the attached figures, various illustrative embodiments of the devices and methods disclosed herein will now be described in more detail.

At a very high level, the inventor has discovered that, by making an EUV mask from a plurality of multilayer pairs of silicon and ruthenium, the effective reflection plane ($Z_{eff}$) of the EUV mask may be moved closer to the uppermost surface of the multilayer stack, as compared to the location of the effective reflection plane in a typical prior art EUV mask. In turn, this decreases, to at least some extent, the amount of shadowing from a patterned absorber when the novel EUV mask is used in production. Accordingly, at least some of the problems mentioned in the background section of this application as a result of undesirable shadowing may be reduced or eliminated.

Figure 2:
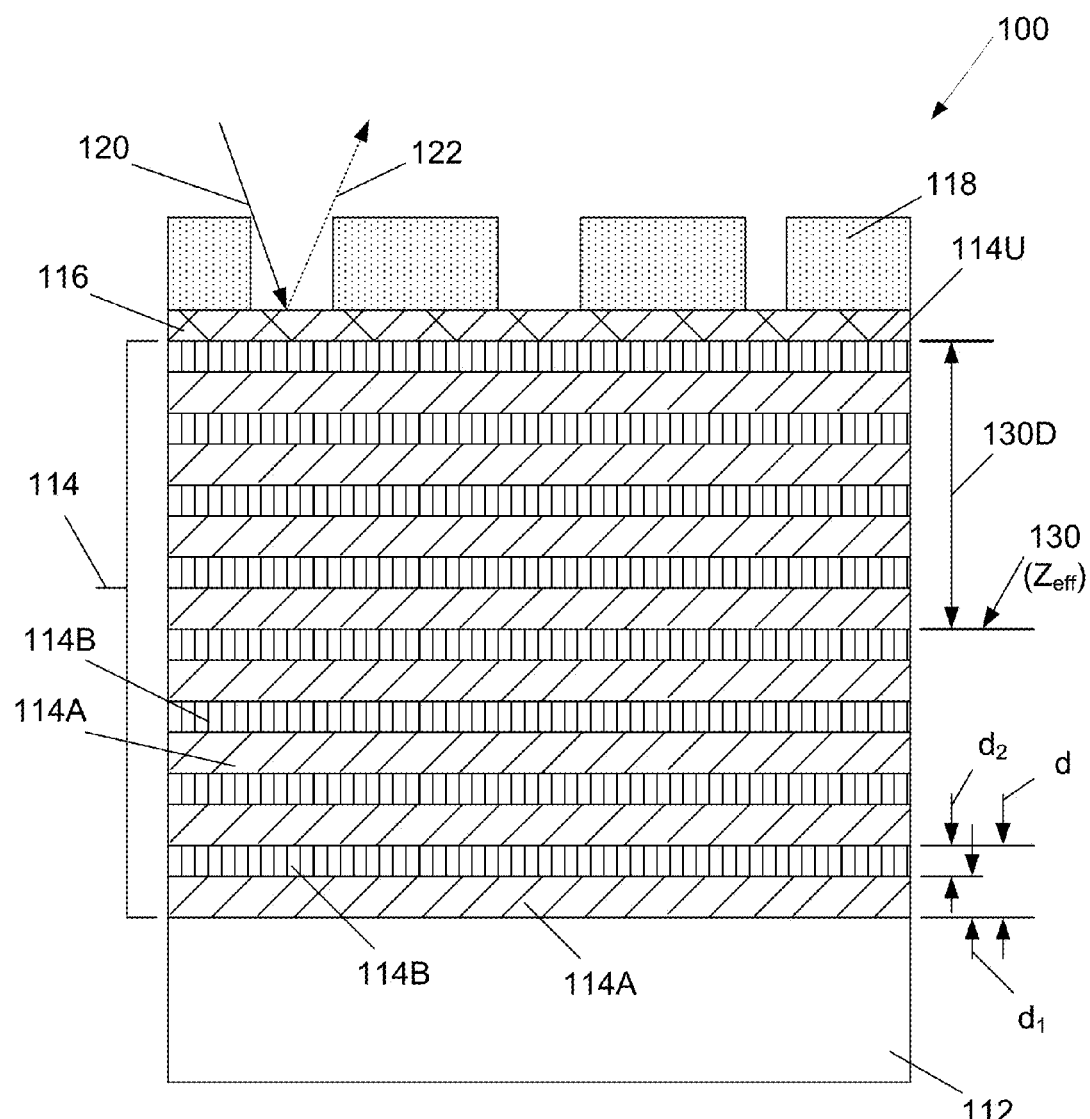
FIG. 2 is a cross-sectional view of one illustrative embodiment of a novel EUV mask disclosed herein.

FIG. 2 is a cross-sectional view of one illustrative embodiment of a novel EUV mask 100 disclosed herein. The mask 100 generally includes a substrate 112, a multilayer film stack 114, a cap layer 116 and a patterned absorber layer 118. The multilayer stack 114 is comprised of a plurality of multilayer pairs, wherein each multilayer pair is comprised of a first layer 114A and a second layer 114B. In one example, the first layer 114A may be a layer of ruthenium (Ru) and the second layer 114B may be a layer of silicon (Si). Depending upon the particular application, the mask 100 may include about 13-34 of such multilayer pairs. The thickness of the layers 114A, 114B is established such that incident light 120 is reflected—in phase—from each of the interfaces in the multilayer stack 114. In one illustrative embodiment, the layers 114A, e.g., ruthenium, may have a thickness ("$d_1$") that falls within the range of about 2.5-3.6 nm, while the layers 114B, e.g., silicon, may have a thickness ("$d_2$") that falls within the range of about 3.6-4.8 nm. The layers 114A, 114B are manufactured so as to have a predetermined period "d" that is the sum of the combined thicknesses ($d_1+d_2$) of the layers 114A, 114B. Based upon the theory of optical interference, the thicknesses of the layers 114A, 114B are specified so that the phases of the reflecting light waves that reflect from the interface between the two layers coincide with each other. If desired, interface engineering techniques may be employed to improve the Ru—Si interfaces, as can be done with the standard Mo/Si multilayers. Differences in the Ru/Si and Mo/Si interfacial layers may be observed dependent on the deposition technique used. See, e.g., Yanagihara et al., "In situ performance tests of soft-x-ray multilayer mirrors exposed to synchrotron radiation from a bending magnet," *Appl Opt.*, 31:972 (1992). Several studies have shown very similar interfacial inter-diffusion properties when comparing Ru/Si and Mo/Si multilayers. See, e.g., Windt et al., "Interface imperfections in metal/Si multilayers," *J. Appl Phys.*, 71:2675 (1992). In one example, the multilayer pairs may be separated by thin boron carbide ($B_4C$) layers that act as a diffusion barrier layer so as to minimize silicide formation. However, such interface engineering techniques need not be performed to practice at least some aspects of the various inventions disclosed herein.

The novel mask 100 disclosed herein may be employed with any known substrate 112, any type of capping layer 116 and any type of absorber 118. The substrate 112 is typically a glass-based substrate with an ultra-low (near-zero) linear thermal expansion coefficient. The capping layer 116 is provided to make the mask 100 more chemically stable and more durable during use and cleaning. In one illustrative embodiment, the capping layer 116 may be a layer of ruthenium having a thickness of about 2 nm. At the point in fabrication depicted in FIG. 2, the absorber 118 has been patterned using traditional electron-beam lithography and known etching processes. The absorber 118 may be comprised of one or more layers of material that are adapted to absorb incident light 120 from a light source (not shown) of an EUV system where the EUV mask 100 disclosed herein will be used in production. For example, the absorber 118 may be comprised of multilayers of tantalum, tantalum nitride, tantalum-boron-nitride, and other similarly absorbing multilayer materials, and it may have a typical overall thickness of about 50-70 nm. In other embodiments, the absorber 118 may be comprised of nickel-containing materials, e.g., a nickel-molybdenum-nickel stack, a nickel-tungsten-platinum stack, etc., where the absorber 118 has an overall height or thickness of about 25-35 nm. Thus, the novel EUV mask 100 disclosed herein should not be considered to be limited to use with any particular type of substrate 112, capping layer 116 or absorber 118. The various layers of material depicted in FIG. 2 may be formed by performing known manufacturing processes, e.g., physical vapor deposition (PVD), chemical vapor deposition (CVD), or plasma-enhanced versions of such processes, etc.

Figure 3A:
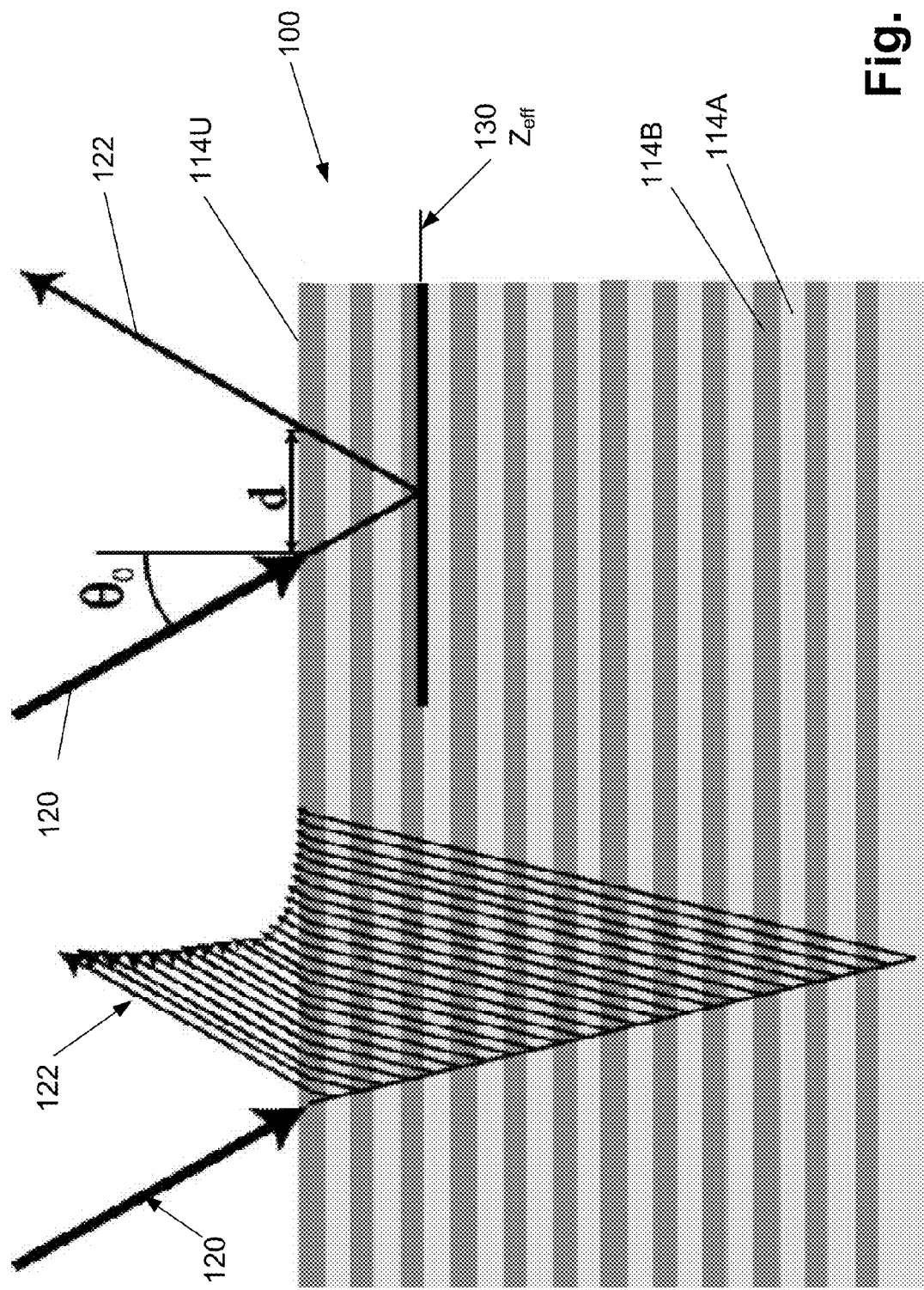
FIGS. 3A-3G are various drawings depicting aspects of the novel mask structure disclosed herein as compared to some illustrative prior art EUV masks.

FIG. 3A is a simplistic depiction of the EUV mask 100 disclosed herein, wherein various parameters have been indicated so as to explain certain functional aspects of the EUV mask 100. In general, a multilayer reflector will experience what will be referred to as a group delay as the incident light 120 is reflected back from the mask 100. The following calculations are based upon the standard characteristic matrix method that is widely used in thin-film optical modeling. The following equations will be referenced in the discussion below.

$$\frac{d}{d|k|}\phi(k, v) = 2z_{eff}\cos\theta \quad \text{Equation 1}$$

$$\tau = -\frac{d\phi}{d\omega} \equiv \frac{\lambda^2}{2\pi c}\frac{d\phi}{d\lambda} \quad \text{Equation 2}$$

$$z_{eff} \approx \frac{1}{2}c\tau \text{ (in vacuum)} \quad \text{Equation 3}$$

where: k=wave vector of light;
  v=unit vector in the direction of light wave propagation;
  $Z_{eff}$=effective reflection plane (nm);
  θ=angle of incidence (degrees);
  τ=group delay (femtoseconds (fs));
  φ=phase change of light upon reflection (radians);
  λ=wavelength (nm); and
  c=velocity of light (299.792458 nanometers per femtosecond).

Figure 3B:
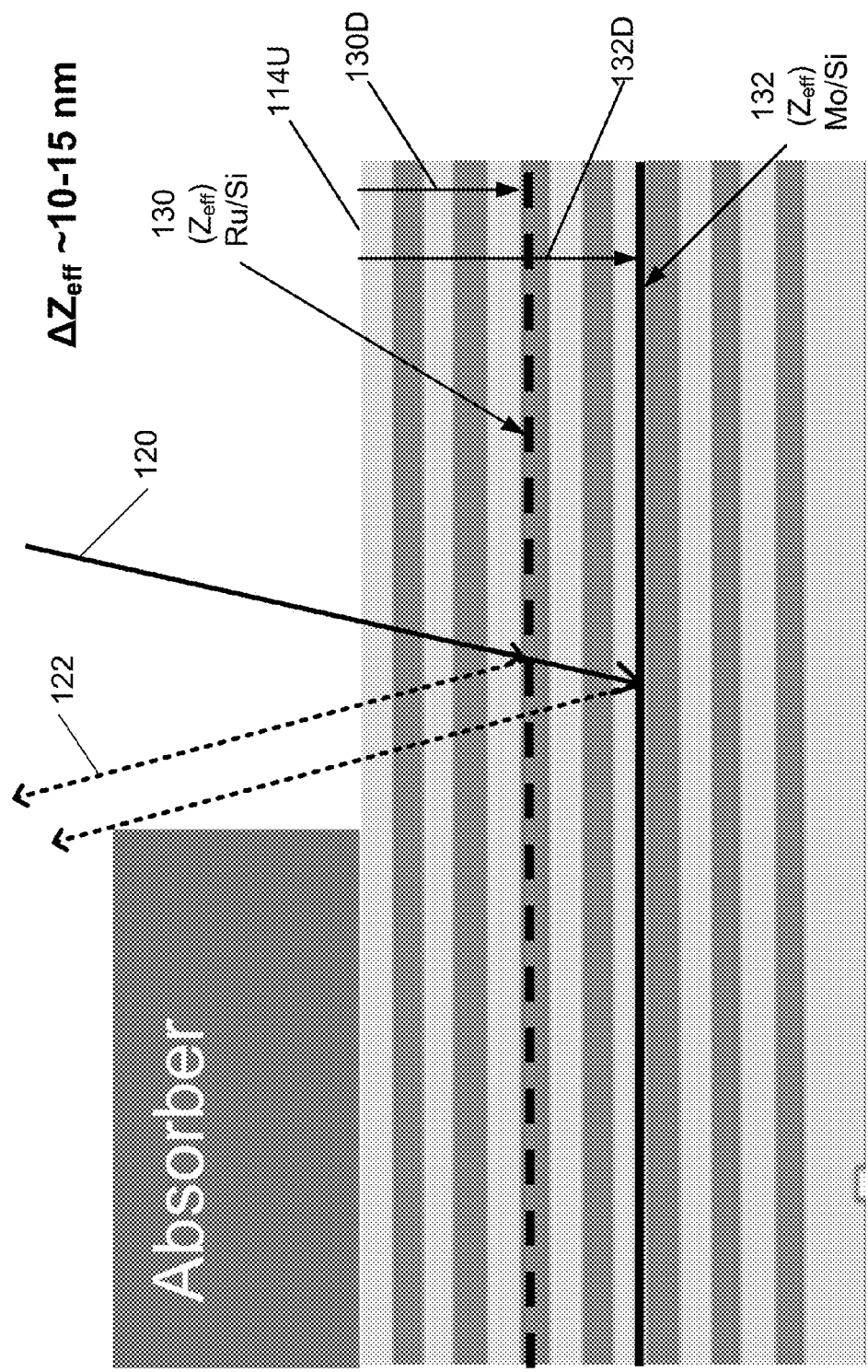

The above equations are based upon the following assumptions. The model is based on a 1-D approximation and is a good approximation for angles of incidence less than 20 degrees. Equation 1 mathematically describes the change in phase of a wave vector as it is reflected back from an interface between the layers 114A, 114B. Equation 2 mathematically describes the group delay (τ) of the collection of all (nominally infinite) reflected light waves 122 that are reflected back from the mask 100. Equation 3 mathematically describes the effective reflection plane ($Z_{eff}$) (in vacuum) of the overall mask 100 as a result of the group delay associated with the reflected wave-packet. FIG. 3B is a drawing that compares the effective reflection plane ($Z_{eff}$) 130 (see FIG. 2) of the novel mask 100 disclosed herein with a representative prior art EUV mask (Mo/Si multilayers) with an effective reflection plane ($Z_{eff}$) 132. As can be seen in FIG. 3B, relative to the upper surface 114U of the multilayer stack, the effective reflection plane ($Z_{eff}$) 130 of the novel mask 100 disclosed herein is positioned at a depth 130D that is less than (or shallower than) the depth 132D of the effective reflection plane ($Z_{eff}$) 132 of the illustrative prior art EUV mask. In relative terms ($\Delta Z_{eff}$), the effective reflection plane ($Z_{eff}$) 130 is positioned about 10-15 nm closer to the uppermost surface 114U of the multilayer stack (as compared to a standard Mo/Si ML mask) which effectively reduces the amount of shadowing caused by the absorber 118.

Figure 3C:
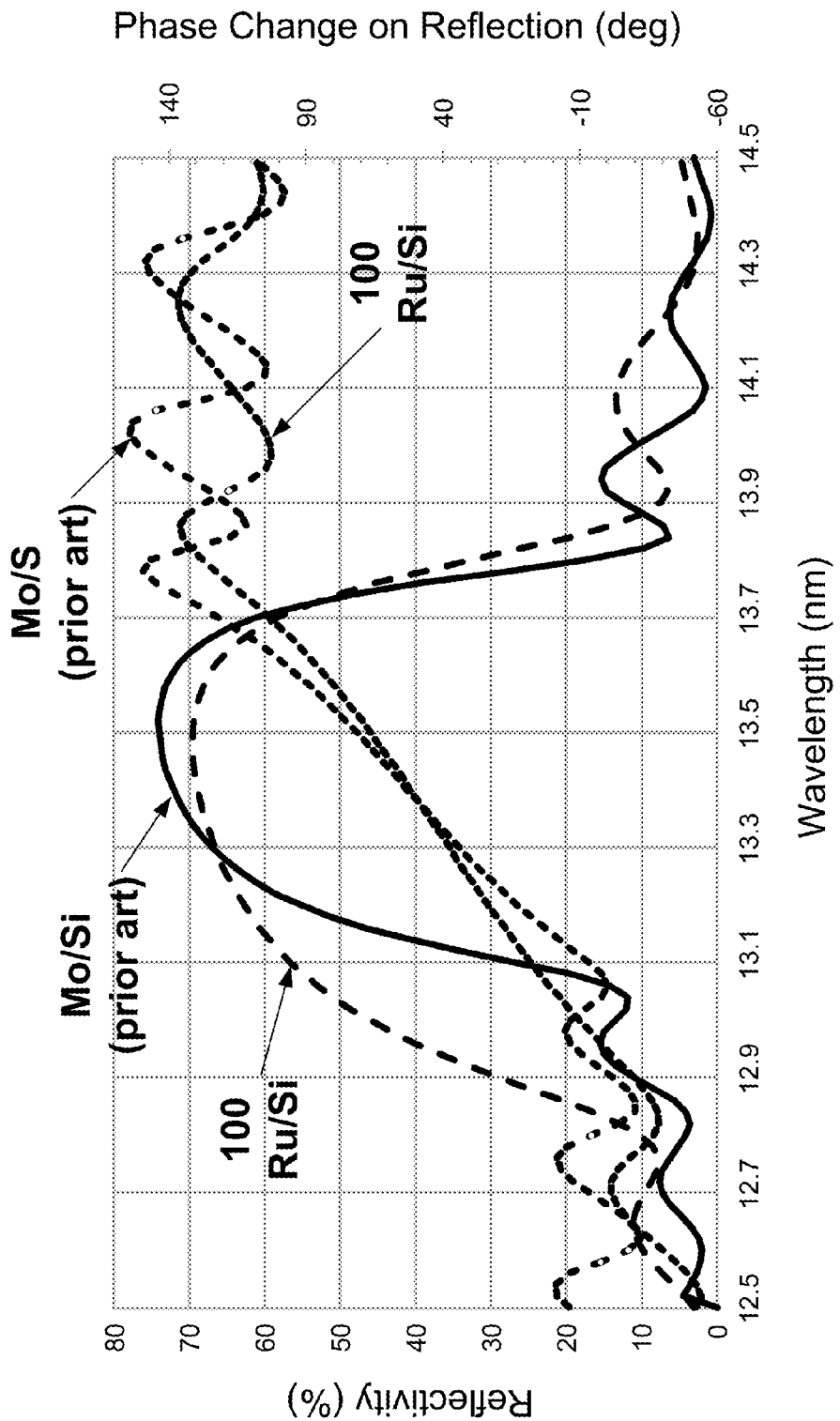

FIG. 3C is a drawing that compares one illustrative embodiment of the novel mask 100 disclosed herein that is comprised of ruthenium-silicon multilayers with a representative prior art EUV mask comprised of molybdenum-silicon multilayers. In the drawing, the horizontal axis is the wavelength, the left vertical axis is the reflectivity and the right vertical axis is the phase change of the light when it is reflected from the mask. More specifically, the illustrative mask 100 represented in FIG. 3C is a 34 period, Ru/Si multilayer mask (34 sets of bi-layers 114A, 114B) with a 2 nm ruthenium capping layer, wherein the thickness of the layers of ruthenium in the multilayer stack was about 3 nm and the thickness of the layers of silicon was about 4.1 nm. The prior art mask represented in FIG. 3C is a 40 period, Mo/Si multilayer mask with a 2 nm ruthenium capping layer, wherein the thickness of the layers of molybdenum in the multilayer stack was about 2.8 nm and the thickness of the layers of silicon was about 4.2 nm. As can be observed from FIG. 3C, the prior art mask has a greater peak reflectivity value than does the mask 100 disclosed herein at wavelengths in and around 13.5 nm, about 75% versus 70%, respectively. This is due to the fact that molybdenum (k=0.0064) absorbs less of the incident light than ruthenium (k=0.0165). However, as can also be seen from FIG. 3C, the novel mask 100 disclosed herein has a broader reflectivity band than does the prior art Mo/Si mask. This broader reflectivity is due to the larger "delta n" value between the materials of the Ru/Si mask 100 disclosed herein ($\Delta n = 0.119$) as compared to the "delta n" value between the materials of the prior art Mo/Si mask ($\Delta n = 0.069$). As a result of the broader reflectivity band, there is a lower delay time (τ) associated with the mask 100 disclosed herein. This is a direct consequence of the time-bandwidth product relation, akin to the uncertainty principle. Accordingly, the depth of the effective reflection plane ($Z_{eff}$) 130 of the Ru/Si mask 100 (relative to the uppermost surface of the multilayer stack 114) is less than the depth of the effective reflection plane ($Z_{eff}$) of the prior art mask Mo/Si mask depicted in FIG. 3C.

Figure 3D:
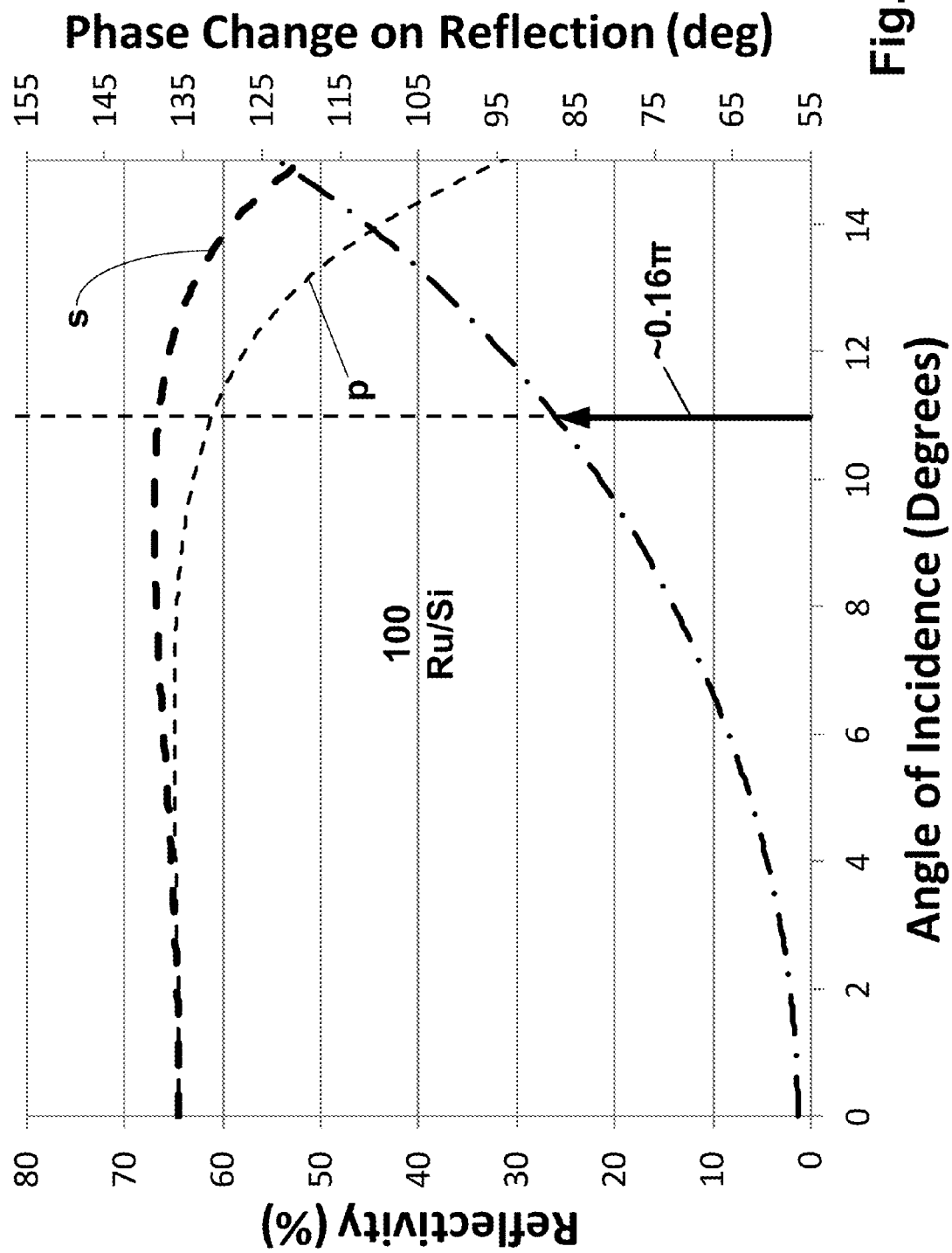
Figure 3E:
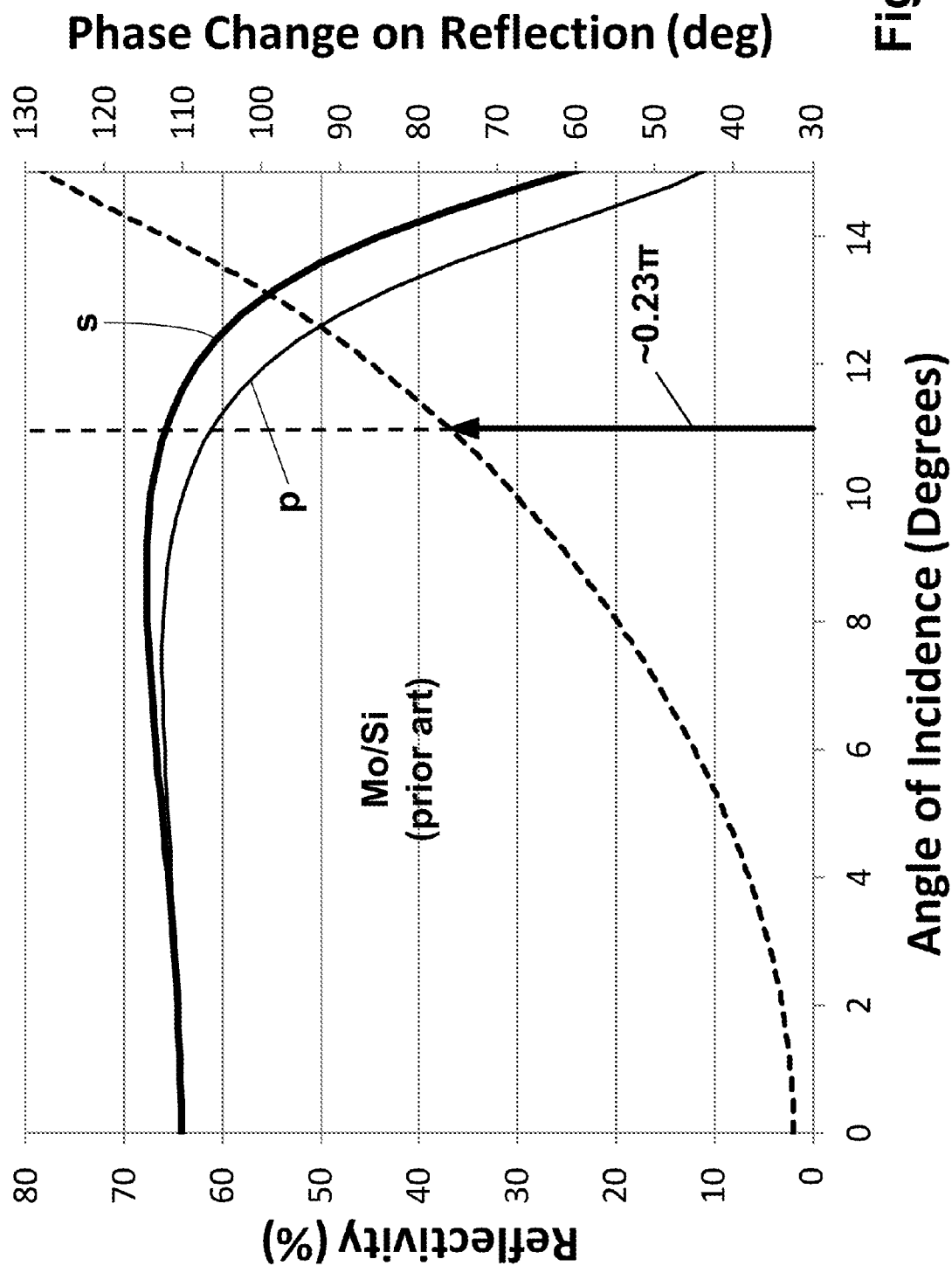

FIGS. 3D-3E are drawings that depict reflectivity (vertical axis) versus angle of incidence (horizontal axis) for another illustrative embodiment of the novel mask 100 disclosed herein (FIG. 3D) that is comprised of ruthenium-silicon multilayers with another representative prior art EUV mask (FIG. 3E) comprised of molybdenum-silicon multilayers. The reflectivity for the two polarization planes ("s" and "p") are also depicted in these figures. The mask designs reflected in FIGS. 3D-3E were intended for use on an EUV system with a numerical aperture (NA) of about 0.33 with an assumed chief ray angle (CRA) of about 6 degrees. It should also be noted that, in FIG. 3D, the reflectivity is measured at an angle of incidence of about 11 degrees, as that is the maximum angle of incidence for a mask optimized for NA=0.33. The illustrative novel mask 100 represented in FIG. 3D is an 18 period, Ru/Si multilayer mask with a 2 nm ruthenium capping layer, wherein the thickness of the layers of ruthenium in the multilayer stack was about 3.4 nm and the thickness of the layers of silicon was about 3.6 nm. The prior art mask represented in FIG. 3E is a 33 period, Mo/Si multilayer mask with a 2 nm ruthenium capping layer, wherein the thickness of the layers of molybdenum in the multilayer stack was about 3.0 nm and the thickness of the layer of silicon was about 3.9 nm. As can be observed from a comparison of FIGS. 3D and 3E, there is no peak reflectivity advantage in utilizing the prior art Mo/Si MLs for NA=0.33. Due to the broader spectral response, the Ru/Si MLs will be more advantageous at higher NA up to, for example, 0.45. In addition, the phase change of ~0.16π radians, for an AOI change of 11 degrees for Ru/Si (FIG. 3D), compared to ~0.237π for Mo/Si (FIG. 3E), potentially relaxes the optical design requirements in the imaging (projection) optics, which would be very advantageous given the stringent aberration and other design constraints in place on the projection optics.

Figure 3F:
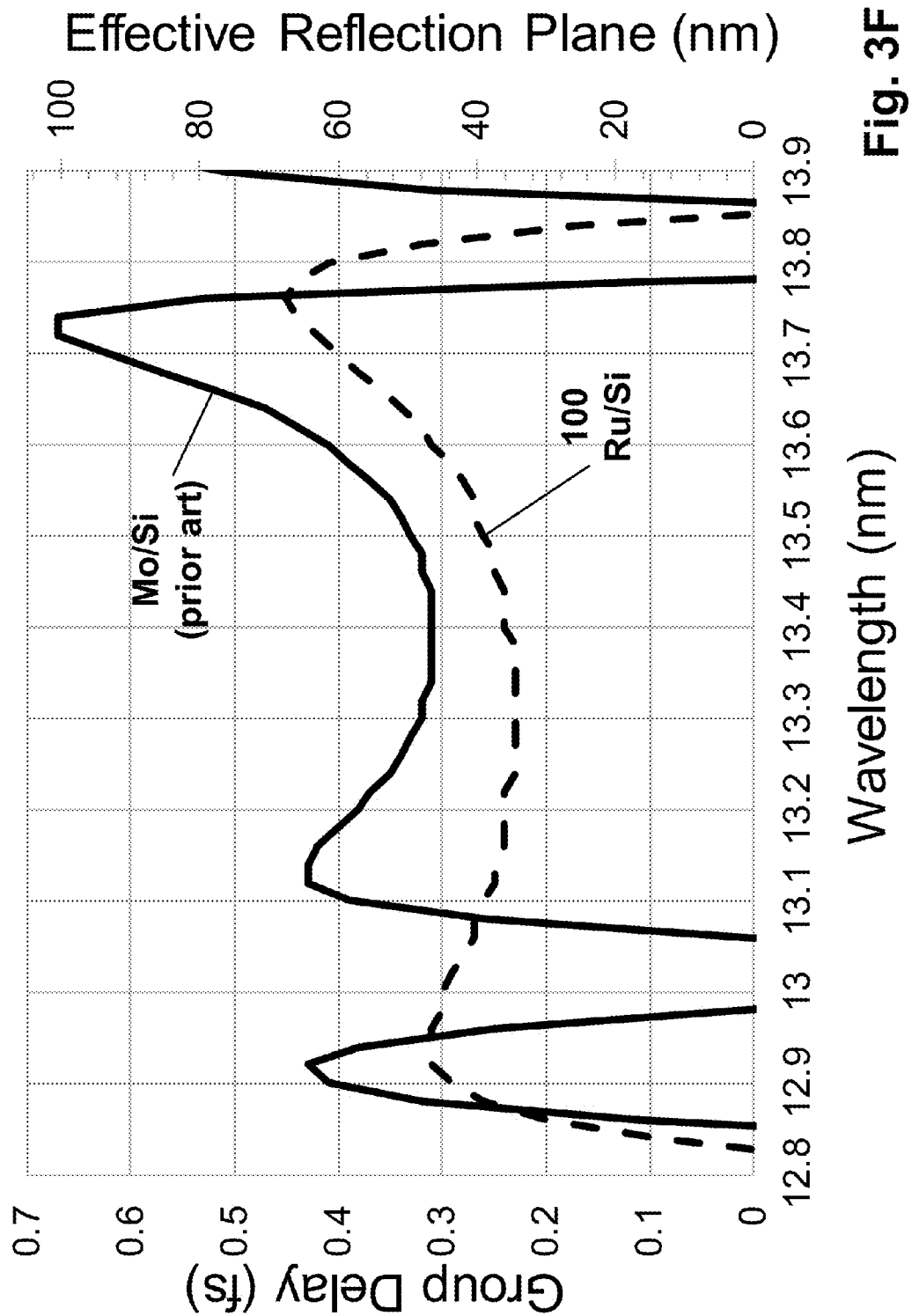
Figure 3G:
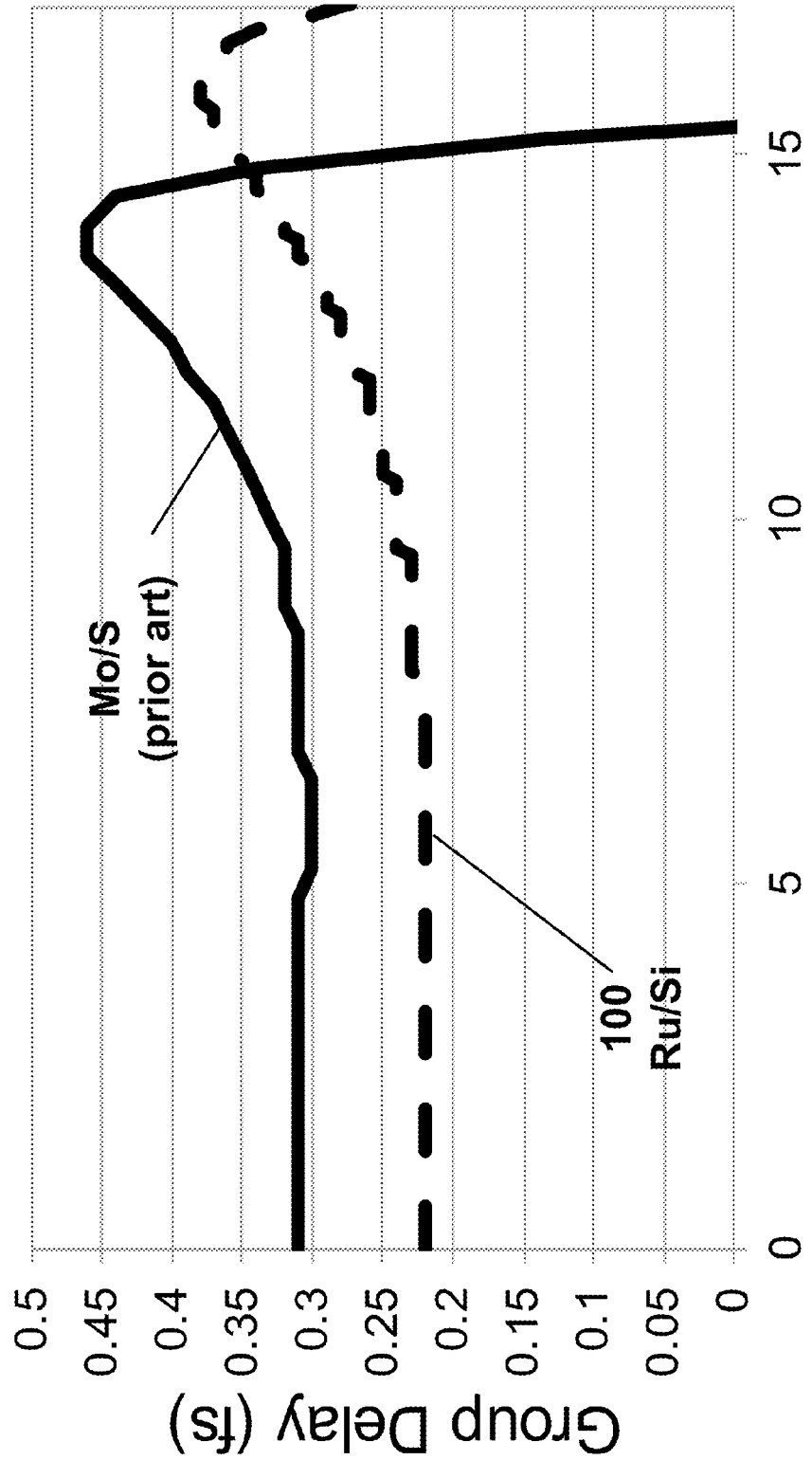

FIGS. 3F-3G are drawings that also depict a comparison between the mask 100 and the prior art mask that were described above in connection with FIGS. 3D-3E. In FIG. 3F, the horizontal axis is the wavelength (nm), the left vertical axis is the group delay (τ) and the right vertical axis is the position of the effective reflection plane ($Z_{eff}$) below the uppermost surface of the multilayer stack. As can be seen in FIG. 3F, the novel mask structure 100 disclosed herein has a lesser group delay time (τ) than that of the prior art Mo/Si EUV mask, about 0.22 fs versus about 0.32 fs, respectively, at a wavelength of about 13.5 nm. Accordingly, the effective reflection plane ($Z_{eff}$) 130 of the Ru/Si mask 100 is positioned closer to the uppermost surface (i.e., "0" in FIG. 3F) of the multilayer stack than the effective reflection plane ($Z_{eff}$) of the prior art mask Mo/Si mask, e.g., about 33 nm versus about 45 nm, respectively. FIG. 3G is a comparison of the group delay versus the angle of incidence (AOI) for the two masks. As can be seen in this drawing, at all angles of incidence of interest (up to about 11 degrees), the novel mask structure 100 disclosed herein has a lower group delay time (τ) than that of the prior art Mo/Si EUV mask, e.g., about 0.22-0.25 fs versus about 0.32-0.35 fs, respectively. Additionally, the overall reflectivity of the novel mask structure 100 disclosed herein may fall with the range of about 65-68%.

Figure 4A:
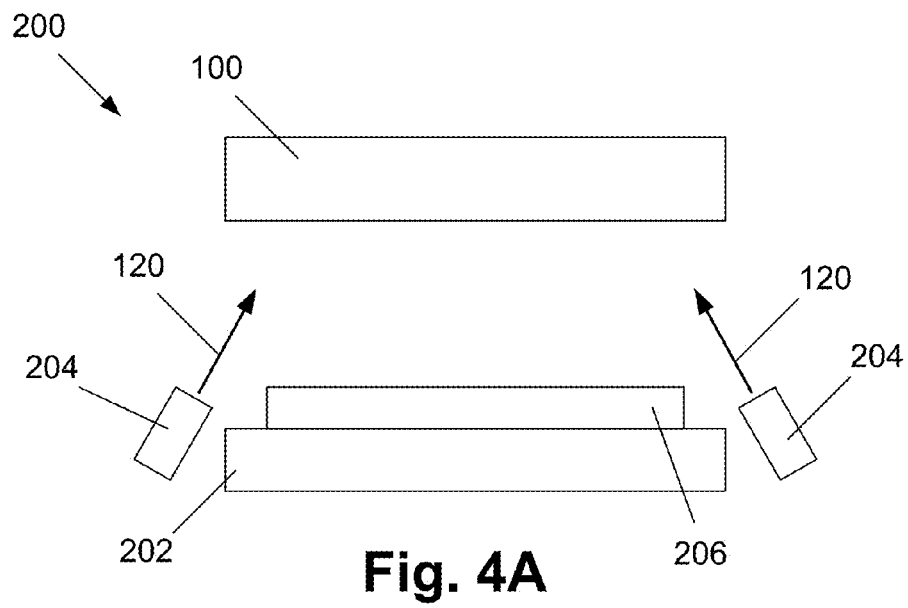
FIGS. 4A-4B depict one example of an illustrative system where the novel EUV mask may be employed in manufacturing integrated circuit products.
Figure 4B:
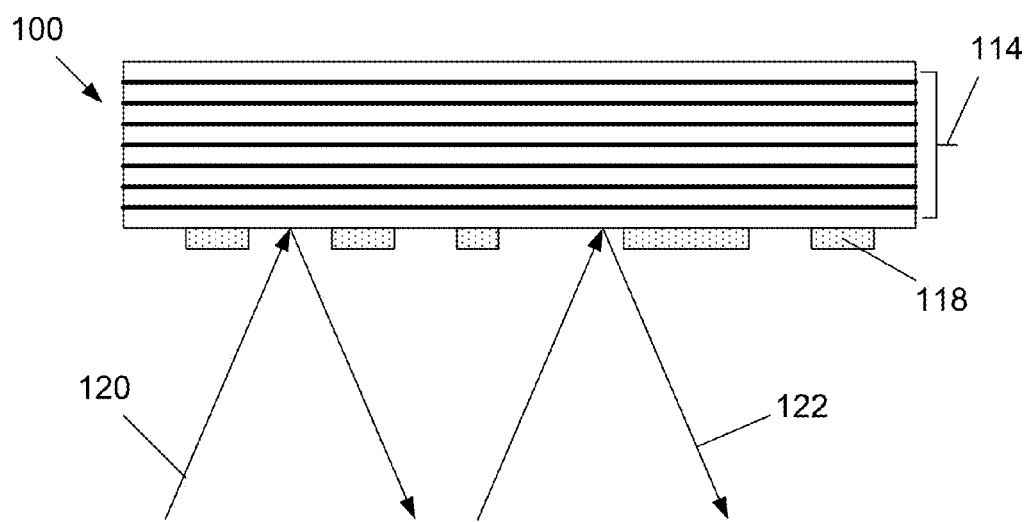

FIGS. 4A-4B are schematic depictions of an illustrative EUV photolithography system or tool 200 where the EUV mask 100 may be employed in manufacturing integrated circuit products. FIG. 4B is an enlarged portion of the EUV system 200. As shown in FIG. 4A, the EUV photolithography system or tool 200 is generally comprised of the EUV mask 100 disclosed herein, a substrate or wafer support stage 202 and a source of EUV radiation 204. The EUV radiation source 204 is adapted to generate EUV radiation 120 that is to be directed toward the mask 100 and reflected therefrom. The photolithography system or tool 200 may comprise multiple mirrors or lenses (not shown) for directing the EUV radiation 120 as desired. An illustrative silicon wafer 206, comprised of multiple die (not shown) where integrated circuit devices are being formed is positioned on the wafer stage 202. Of course, as will be appreciated by those skilled in the art, the schematic depiction of the EUV system or tool 200 is simplistic in nature and it does not depict all aspects of a real-world EUV photolithography system or tool. Nevertheless, with benefit of the present disclosure, one skilled in the art will be able to employ the EUV mask 100 disclosed herein on such EUV tools and systems.

As depicted in FIG. 4B, the mask 100 has a patterned absorber layer 118 and the schematically depicted multilayer stack 114 described above. The mask 100 is tuned to reflect EUV radiation of a given wavelength, e.g., 20 nm or less, and in some cases about 13.5 nm. Incident light 120 is reflected off of the mask 100 and reflected light 122 is ultimately directed toward a layer of light-sensitive material (not shown), e.g., photoresist, that is formed above the substrate 206.

One illustrative method disclosed herein involves positioning the EUV mask 100 in a photolithography system, where the EUV mask 100 is comprised of the above-described multilayer stack 114, wherein the mask 100 is adapted to, when irradiated with EUV light having a wavelength of 20 nm or less, have an effective reflective plane that is positioned 32 nm or less below an uppermost surface of the multilayer stack, directing the EUV light toward the EUV mask, and irradiating a first layer of light-sensitive material positioned above a first substrate with a portion of the EUV light that reflects off of the EUV mask. In further embodiments, after the first layer of light-sensitive material is irradiated, the first substrate is removed from the system and a second substrate with another layer of light-sensitive material is positioned in the photolithography system and the process is repeated.

After a complete reading of the present application, those skilled in the art will readily appreciate several significant advantages offered by the use of the novel EUV mask 100 disclosed herein. First, since the effective reflection plane ($Z_{eff}$) 130 is positioned about 10-15 nm closer to the uppermost surface 114U of the multilayer stack (as compared to prior art masks), the amount of shadowing caused by the absorber 118 is effectively reduced. In turn, this may help to avoid some of the problems associated with shadowing as noted in the background section of this application. Second, the number of multilayer pairs in the mask 100 (e.g., 13-33) disclosed herein may be less than the number of multilayer pairs used in a typical prior art EUV Mo/Si mask (e.g., about 40-50 pairs or more). This results in at least two distinct advantages. In general, each time incident light is reflected off of an interface, there is some loss of light, i.e., some of the incident light is absorbed. Thus, producing an acceptable mask with fewer multilayer pairs means that there are fewer interfaces. Accordingly, in the EUV mask 100 disclosed herein, there will be less absorption of the incident light due to the reduced number of multilayer pairs used therein. Another advantage is related to the manufacturing of the mask itself. Simply put, the greater the number of multilayer pairs that are to be formed to make a EUV mask, the higher the manufacturing costs. Additionally, there are more chances for manufacturing errors as the number of multilayer pairs on a EUV mask increases. Other advantages will be recognized by those skilled in the art after a complete reading of the present application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    positioning an EUV mask in a photolithography system, wherein said EUV mask is comprised of a multilayer stack comprised of a plurality of multilayer pairs of ruthenium and silicon, wherein said multilayer stack has an uppermost surface and wherein said mask is adapted to, when irradiated with light having a wavelength of 20 nm or less, have an effective reflective plane that is positioned 32 nm or less below said uppermost surface of said multilayer stack;
    directing an EUV light having a wavelength of 20 nm or less toward said EUV mask; and
    irradiating a first layer of light sensitive material positioned above a first substrate with a portion of said EUV light that reflects off of said EUV mask.

2. The method of claim 1, further comprising, after irradiating said first layer of light sensitive material, removing said first substrate and positioning a second substrate having a second layer of light sensitive material formed there above, and performing the steps recited in claim 1 on said second layer of light sensitive material.

3. The method of claim 1, wherein said EUV light has a wavelength of about 13.5 nm.

4. The method of claim 1, wherein each of said layers of ruthenium in said multilayer stack has a thickness that falls within a range of about 2.5-3.6 nm and wherein each of said layers of silicon in said multilayer stack has a thickness that falls within a range of about 3.6-4.8 nm.

5. A method, comprising:
    positioning an EUV mask in a photolithography system, wherein said EUV mask is comprised of a multilayer stack comprised of a plurality of multilayer pairs of ruthenium and silicon, wherein said multilayer stack has an uppermost surface and wherein said mask is adapted to, when irradiated with light having a wavelength of 20 nm or less, have an effective reflective plane that is positioned 32 nm or less below said uppermost surface of said multilayer stack, and wherein each of said layers of ruthenium in said multilayer stack has a thickness that falls within a range of about 2.5-3.6 nm and wherein each of said layers of silicon in said multilayer stack has a thickness that falls within a range of about 3.6-4.8 nm;
    directing an EUV light having a wavelength of 20 nm or less toward said EUV mask; and
    irradiating a first layer of light sensitive material positioned above a first substrate with a portion of said EUV light that reflects off of said EUV mask.

6. The method of claim 5, further comprising, after irradiating said first layer of light sensitive material, removing said first substrate and positioning a second substrate having a second layer of light sensitive material formed there above, and performing the steps recited in claim 5 on said second layer of light sensitive material.

7. The method of claim 6, wherein said EUV light has a wavelength of about 13.5 nm.

* * * * *